United States Patent [19]

Hoffman

[11] Patent Number: 4,686,112

[45] Date of Patent: Aug. 11, 1987

[54] DEPOSITION OF SILICON DIOXIDE

[75] Inventor: Dorothy M. Hoffman, Titusville, N.J.

[73] Assignee: RCA Corporation, Princeton, N.J.

[21] Appl. No.: 457,578

[22] Filed: Jan. 13, 1983

[51] Int. Cl.$^4$ ............................................. B05D 3/06
[52] U.S. Cl. .................................. 427/42; 427/255.3;
427/404; 427/407.1; 427/419.2; 427/419.5
[58] Field of Search .................... 427/42, 419.2, 255.3,
427/419.5, 255, 409, 407.1, 404, 402, 294

[56] References Cited

U.S. PATENT DOCUMENTS

| | | | |
|---|---|---|---|
| 3,306,768 | 2/1967 | Peterson | 427/255.3 |
| 3,522,080 | 7/1970 | Dietzel et al. | 427/42 |
| 3,850,687 | 11/1974 | Kern | 427/255.3 |
| 4,196,232 | 4/1980 | Schnable | 427/255.3 |
| 4,216,501 | 8/1980 | Bell | 358/128.5 |
| 4,282,270 | 8/1981 | Nozaki et al. | 427/255.3 |

OTHER PUBLICATIONS

Pliskin et al., *Journal of the Electrochemical Society*, vol. 112, No. 10, pp. 1013–1019, (1965).

Primary Examiner—Norman Morgenstern
Assistant Examiner—Janyce A. Bell
Attorney, Agent, or Firm—Joseph S. Tripoli; Fred Jacob; R. Hain Swope

[57] ABSTRACT

An improved method of forming layers of silicon dioxide on a substrate whereby high quality films are prepared at ambient temperature. The films are formed by electron beam evaporation in the presence of oxygen containing water vapor.

3 Claims, 1 Drawing Figure

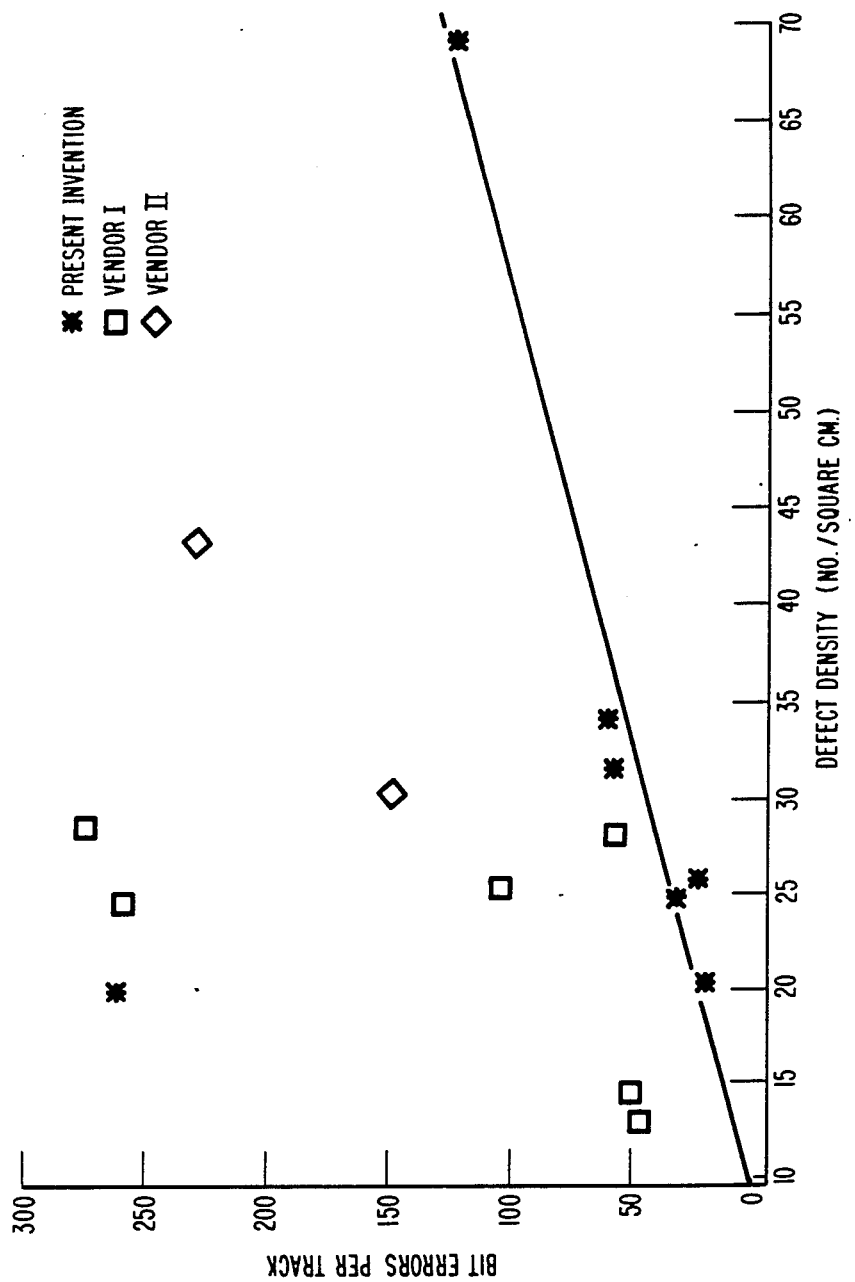

DEPOSITION OF SILICON DIOXIDE

This invention relates to the deposition of thin layers of silicon dioxide on a substrate. More particularly, this invention relates to depositing low stress layers of silicon dioxide on a substrate.

BACKGROUND OF THE INVENTION

There are a number of recognized methods of depositing layers of silicon dioxide on a substrate. Because of the widespread use of silicon dioxide layers in the electronics industry, the merits and shortcomings of the various deposition methods have been discussed at length in the literature. Overall, it would be of significant advantage for a number of applications to be able to deposit high quality thin layers of silicon dioxide without using high temperatures which can be detrimental to heat-sensitive devices and structures.

One commonly utilized method of depositing layers of silicon dioxide is by thermal oxidation, of silicon, i.e. heating a structure having a layer of silicon or an alloy thereof in the presence of oxygen. While effective, this method requires very high temperatures, on the order of 800° C. or higher, and is therefore unsuitable for applications involving a heat-sensitive substrate.

Silicon dioxide films may also be deposited by chemical vapor deposition (CVD) or low pressure chemical vapor deposition (LPCVD). These techniques likewise require that the substrate surface be heated. Although the temperatures involved are not as high as are required for thermal oxidation, being on the order of 550° C.-600° C., there is still a good possibility that sensitive devices may be adversely affected. In addition, because of defects usually present at formation, frequently it is necessary that silicon dioxide layers deposited in this way be steam annealed at high temperatures to be acceptable for certain applications. The substrates must be transferred to, e.g. an annealing furnace, for this step. This transfer requires additional time and handling and can result in contamination of the surface of the silicon dioxide layer. Silicon dioxide layers may also be formed by sputtering. However, good quality layers can only be obtained by using high substrate temperatures.

There are additional known methods of depositing silicon dioxide layers such as evaporation, particularly by electron beam. While evaporation techniques do utilize lower temperatures, the layers produced thereby generally have strains and/or porosity and are therefore regarded to be inferior to layers produced by high temperature processes such as thermal oxidation, sputtering or steam annealing. The presence of strains is particularly disadvantageous where the layers must be relatively thick. Such layers can be improved by steam annealing which, of course, negates the advantage of low temperature deposition.

In accordance with this invention, there is provided a method whereby layers of silicon dioxide can be deposited at ambient temperature, which layers are equivalent in stoichiometry and low stress to layers formed or annealed at high temperatures.

SUMMARY OF THE INVENTION

Excellent layers of silicon dioxide are obtained by an electron beam evaporation method at ambient temperature under vacuum where water vapor is added to the oxygen in the vacuum chamber during deposition.

BRIEF DESCRIPTION OF THE DRAWING

The FIGURE is a graph of bit errors per track in composite optical recording discs as a function of defect density in the planarizing layer.

DETAILED DESCRIPTION OF THE INVENTION

Electron beam evaporation is a known technique of depositing silicon dioxide layers which can be carried out utilizing commercially available apparatus. The deposition is carried out in a vacuum chamber and means are usually provided to rotate the substrate during deposition thereby providing a more uniform coating.

In accordance with this invention, layers of silicon dioxide are formed by electron beam evaporation at ambient temperature which are comparable in certain critical respects to layers previously produced only by steam annealing or thermal oxidation at high temperatures. The quality of the subject layers is unexpected because, heretofore, layers so-formed were considered inferior for certain applications unless strains and/or porosity were substantially reduced by steam annealing.

The silicon dioxide layers of this invention are produced by modifying conventional electron beam evaporation procedure by adding water vapor to the vacuum chamber during deposition. It is known to form silicon dioxide layers by the electron beam evaporation of, e.g. pure silica, in the presence of oxygen. Heretofore, however, care was taken to eliminate as much water vapor as possible from the system. This was done because water vapor is generally considered to be deleterious in depositions by electron beam because of undesirable reactions with the substrate and/or the growing film. It appears herein, however, that the oxygen ions produced by ionizing the water vapor aid in the complete oxidation of the $SiO_x$ being evaporated from the target. There are produced high quality layers comparable spectroscopically, but less dense, than those which have been steam annealed or which were formed at high temperature.

In accordance with this invention, the substrate to be coated with silicon dioxide is placed in a conventional vacuum chamber along with a source material, e.g. pure fused silica. The chamber is evacuated to at least about $3 \times 10^{-6}$ Torr., and then backfilled to a pressure of about $1.5 \times 10^{-5}$ Torr with oxygen and water vapor. The oxygen/water vapor mixture is provided simply by bubbling dry oxygen through water prior to introducing it into the vacuum chamber. The oxygen thereby becomes "saturated" with water vapor at ambient temperature. Deposition is carried out until a silicon dioxide layer of the desired thickness is formed.

The process of this invention is particularly advantageous for forming layers of silicon dioxide on devices such as the optical, anti-reflective information records disclosed and claimed in U.S. Pat. No. 4,216,501, the disclosure of which is incorporated herein by reference. The information storage media disclosed in the aforementioned patent comprises a substrate disc which is coated with a layer of a reflective material such as aluminum. Overlying the reflective layer is a layer of a dielectric material, e.g. silicon dioxide, which is transparent at the frequency of a recording light beam. The dielectric material is in turn coated with a thin layer of a material which is absorptive at the frequency of the recording light beam such as titanium or, preferably, tellurium. The disc is recorded by controlling the intensity of the recording light so that selected portions of the absorptive layer are optically changed thereby forming an information track readable with a light beam of the same frequency, but of lower intensity.

Low cost disc substrates can be made of plastics, such as polyvinyl chloride, polyethylene terephthalate and the like, or aluminum which preferably has a planarizing layer of optically smooth plastic deposited thereon. The thin reflective layer of aluminum is then deposited over the planarizing layer. It will be appreciated that high temperature deposition of the succeeding silicon dioxide layer, or a steam annealing step would be highly detrimental to such a structure because, if the planarizing layer and the reflective layer are deformed, it is impossible to read the information pattern in the absorptive layer.

Silicon dioxide layers having strains are likewise undesirable for use in such information discs. High compressive stresses, normally found in evaporated silicon dioxide, cause defects such as pinpoint holes which may not be covered by the thin absorptive layer or which may distort it. A pinpoint hole in the silicon dioxide layer may distort or disturb a readout light beam causing spurious information patterns or "noise" which degrades the overall quality of the disc. It is evident that the subject method, which provides silicon dioxide layers with substantially reduced strain and porosity in comparison to other deposition methods carried out at low or ambient temperature, is particularly suited to the production of such high density information discs.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE

The substrates for deposition of silicon dioxide were aluminum discs having thereon a planarizing layer of a commercial urethane plastic. A layer of aluminum about 500 angstroms thick was, in turn, evaporated onto the plastic. The substrates were placed individually onto a holder platform in a vacuum chamber equipped with a commercial high power electron gun. A source material of pure fused silica was placed in the hearth in the vacuum chamber.

The vacuum chamber was evacuated to a pressure of $3 \times 10^{-6}$ Torr., and then backfilled with a mixture of oxygen and water vapor to a pressure of $1.5 \times 10^{-5}$ Torr. The mixture was obtained by passing dry oxygen through 300 ml of deionized water in a 500 ml flask at ambient temperature and thereafter causing it to flow into the chamber.

Deposition was begun by irradiating the source material with a 10keV electron beam. Deposition was continued for 25 seconds which produced a layer of silicon dioxide 500 angstroms thick.

The layers of silicon dioxide on several discs were examined microscopically and found to be clearly superior to a comparable layer formed in an atmosphere of dry oxygen both in terms of strain defects, i.e. surface distortions, and pinholes.

COMPARATIVE EXAMPLE

Samples of aluminum discs as in the above Example were examined prior to aluminizing for micro-defects in the planarizing layer. All samples were coated with aluminum as in the Example. An area 500cm square was randomly selected on each disc. The number of defects was counted and the average number per square centimeter calculated. The defects were determined by light scattering techniques which are sensitive to distortions in the aluminum layer. The distortions in the aluminum layer, in turn, indicate the number of defects in the planarizing layer. Some of the substrates were coated with silicon dioxide in accordance with this invention. Others were coated with silicon dioxide by commercial vendors. All samples were then coated with a film of light absorption tellurium approximately 50 angstroms thick.

The coated discs were examined microscopically. It was observed that the tellurium either failed to cover pinholes and surface distortions in the silicon dioxide layer or collapsed into them to some degree thereby becoming less absorptive. An information pattern was recorded in each disc according to U.S. Pat. No. 4,216,501. Microdefects in the surface of the planarizing layer will cause the readout light beam to reflect incorrectly from the recording medium, thus distorting the information pattern by causing holes where there were none and vice versa.

The discs were read using light of the same frequency but lower intensity and the number of bit errors, i.e. incorrect or missing dots of light in the information pattern, in several information tracks was recorded. An information track represents 1/30 second play. At least six tracks were selected from different radii in each disc. The information was averaged for each disc and converted into bit errors per centimeter square. While the sample does not equal the 500 sq. centimeter area of the planarizing layer tested, it has been found to be reliably representative.

Because bit errors may result from defects in the planarizing layer as well as the silicon dioxide layer, it is necessary to determine both in ascertaining the quality of the silicon dioxide layer. The FIGURE is a plot of the average number of micro-defects per square centimeter in the planarizing layer as a function the total number of bit errors per square centimeter of the final disc. It can be seen from the plot that a remarkable consistency in the relation between the two has been achieved in comparison to silicon dioxide coatings by commercial vendors. The coatings by vendors, in almost every instance, showed a substantial increase in bit errors attributable to the silicon dioxide coating. The one substantial increase in bit errors for the subject coatings was subsequently found to result from other than the silicon dioxide layer. The data shown in the FIGURE thus clearly established the superiority of the subject coating method in comparison to those tested.

I claim:

1. In a method of growing a layer of silicon dioxide on a substrate in a vacuum chamber by electron beam evaporation of a source of silicon at ambient temperature in the presence of oxygen, the improvement comprising passing said oxygen through water prior to introducing it into said chamber thereby also introducing water vapor into the chamber.

2. A method in accordance with claim 1, wherein the chamber is evacuated to a pressure of at least about $3 \times 10^{-6}$ Torr and backfilled with oxygen and water vapor to a pressure of about $1.5 \times 10^{-5}$ Torr.

3. A method in accordance with claim 1, wherein said substrate has a planarizing coating of plastic thereon over which is a reflective coating of aluminum.

* * * * *